(12) United States Patent
Okabe (10) Patent No.: US 12,047,044 B2
(45) Date of Patent: Jul. 23, 2024

(54) POWER AMPLIFIER MODULE

(71) Applicant: Murata Manufacturing Co., Ltd., Kyoto (JP)

(72) Inventor: Hiroshi Okabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 556 days.

(21) Appl. No.: 17/325,416

(22) Filed: May 20, 2021

(65) Prior Publication Data

US 2021/0391834 A1 Dec. 16, 2021

(30) Foreign Application Priority Data

Jun. 16, 2020 (JP) ................. 2020-103604

(51) Int. Cl.
| | | |
|---|---|---|
| H03F 1/14 | (2006.01) | |
| H03F 3/195 | (2006.01) | |
| H03F 3/24 | (2006.01) | |
| H03F 3/72 | (2006.01) | |

(52) U.S. Cl.
CPC ............. *H03F 3/245* (2013.01); *H03F 3/195* (2013.01); *H03F 3/72* (2013.01); *H03F 2200/294* (2013.01); *H03F 2200/451* (2013.01)

(58) Field of Classification Search
CPC . H03F 3/245; H03F 3/195; H03F 3/72; H03F 2200/294; H03F 2200/451; H03F 1/0261; H03F 3/20; H03F 1/0277; H03K 2017/066; H03K 2217/0081; H03K 17/693; H03G 1/0088

See application file for complete search history.

(56) References Cited

U.S. PATENT DOCUMENTS

| | | | |
|---|---|---|---|
| 6,804,502 B2 * | 10/2004 | Burgener | H03K 17/6871 257/341 |
| 10,038,409 B2 * | 7/2018 | Nobbe | H04L 27/20 |
| 10,643,962 B1 * | 5/2020 | Ichitsubo | H03F 3/72 |
| 2012/0068757 A1 * | 3/2012 | Seshita | H03K 17/693 327/427 |
| 2016/0269023 A1 | 9/2016 | Seshita | |

FOREIGN PATENT DOCUMENTS

| | | |
|---|---|---|
| JP | 2001237735 A | 8/2001 |
| JP | 2016171438 A | 9/2016 |

* cited by examiner

*Primary Examiner* — Khanh V Nguyen
(74) *Attorney, Agent, or Firm* — Pearne & Gordon LLP (57) ABSTRACT

A power amplifier module includes a first power amplifier that amplifies an input signal and outputs a first transmission signal; a first switch circuit that receives input of the first transmission signal and performs switching to, of a plurality of signal paths, a signal path through which the first transmission signal passes; and a second switch circuit that receives input of the first transmission signal output from the first switch circuit through the signal path to which the first switch circuit has performed switching and switches between signal paths to an antenna terminal. The second switch circuit includes a power supply circuit that supplies a reference voltage to the first switch circuit and the second switch circuit.

8 Claims, 10 Drawing Sheets

POWER AMPLIFIER MODULE

CROSS REFERENCE TO RELATED APPLICATION

This application claims priority from Japanese Patent Application No. 2020-103604 filed on Jun. 16, 2020. The content of this application is incorporated herein by reference in its entirety.

BACKGROUND

The present disclosure relates to a power amplifier module.

In mobile communication terminals, such as cellular phones, a power amplifier module is used that amplifies a radio frequency (RF) signal to be transmitted to a base station. The power amplifier module includes a power amplifier circuit that amplifies an RF signal, a switch circuit that switches between states of connection of an RF signal to a signal path or antenna, and so forth.

A switch system disclosed in Japanese Unexamined Patent Application Publication No. 2016-171438 converts serial data to parallel data to generate a control signal, and thus the switch system is reduced in size. However, in the switch system, of a plurality of switches, in a switch far away from an antenna, a power supply circuit is incorporated that supplies a reference voltage to the plurality of switches. In other words, the power supply circuit is incorporated in the switch near a power amplifier circuit, which is not illustrated. For this reason, in recent integrated modules, there is a possibility that noise caused by the switching on and off of a power supply circuit may be input to a power amplifier circuit due to electromagnetic induction, electrostatic induction, or the like and may be amplified.

BRIEF SUMMARY

Thus, the present disclosure provides a power amplifier module that enables a reduction in the influence of noise caused by a power supply circuit.

A power amplifier module according to one aspect of the present disclosure includes a first power amplifier configured to amplify an input signal and output a first transmission signal; a first switch circuit configured to receive input of the first transmission signal and perform switching to, of a plurality of signal paths, a signal path through which the first transmission signal passes; and a second switch circuit configured to receive input of the first transmission signal output from the first switch circuit through the signal path to which the first switch circuit has performed switching and switch between signal paths to an antenna. The second switch circuit includes a power supply circuit configured to supply a reference voltage to the first switch circuit and the second switch circuit.

The present disclosure can provide the power amplifier module that enables a reduction in the influence of noise caused by the power supply circuit.

Other features, elements, characteristics and advantages of the present disclosure will become more apparent from the following detailed description of embodiments of the present disclosure with reference to the attached drawings.

DETAILED DESCRIPTION

Embodiments of the present disclosure will be described below with reference to the drawings. Here, circuit elements denoted by the same reference numerals refer to the same circuit element, and repeated descriptions of the circuit elements are omitted.

Configuration of Power Amplifier Module 100

Figure 1:
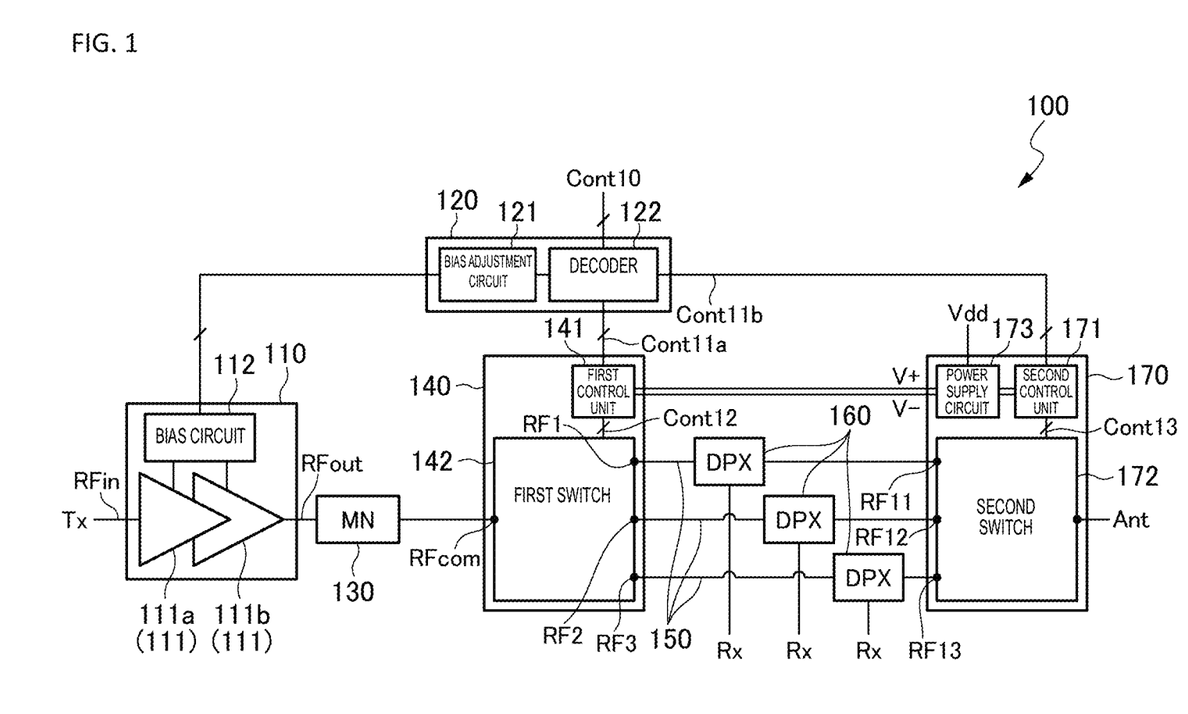
FIG. 1 illustrates an example of a configuration of a power amplifier module according to a first embodiment.

FIG. 1 illustrates an example of a configuration of a power amplifier module 100 according to a first embodiment. The power amplifier module 100 is incorporated, for example, in a mobile communication device, such as a cellular phone. The power amplifier module 100 amplifies the power of an input signal RFin to a level necessary for transmission to a base station and outputs this input signal RFin as an amplified signal RFout. The input signal RFin is a radio frequency (RF) signal modulated, for example, by a radio frequency integrated circuit (RFIC) or the like in accordance with a certain communication scheme. Examples of a communication standard of the input signal RFin include the second generation mobile communication system (2G), the third generation mobile communication system (3G), the fourth generation mobile communication system (4G), the fifth generation mobile communication system (5G), long term evolution (LTE)-frequency division duplex (FDD), LTE-time division duplex (TDD), LTE-Advanced, and LTE-Advanced Pro. The frequency of the input signal RFin ranges, for example, from about several hundred MHz to about several tens of GHz. The communication standard and frequency of the input signal RFin are not limited to these.

As illustrated in FIG. 1, the power amplifier module 100 includes, for example, a power amplifier circuit 110, a control circuit 120, a matching network 130, a first switch circuit 140, a plurality of signal paths 150, duplexers 160, and a second switch circuit 170. Each component is formed, for example, as an IC chip. This IC chip is formed, for example, by a gallium arsenide (GaAs), silicon germanium (SiGe), or silicon-on-insulator (SOI) process.

In the power amplifier module 100, an input signal RFin passes through the power amplifier circuit 110, the matching network 130, the first switch circuit 140, one signal path 150, a duplexer 160, and the second switch circuit 170 in sequence and is transmitted from an antenna terminal Ant.

The power amplifier circuit 110 includes, for example, amplifiers 111 and a bias circuit 112.

For example, the amplifiers 111 amplify the input signal RFin input from a transmitter Tx and output an amplified signal RFout. A first-stage (driver-stage) amplifier 111a amplifies the input signal RFin input from an input terminal (not illustrated) through a matching network (not illustrated) and outputs an amplified signal RF (not illustrated). A subsequent-stage (power-stage) amplifier 111b amplifies the amplified signal RF supplied from the amplifier 111a through a matching network (not illustrated) and outputs the amplified signal RFout. The amplified signal RFout is input to the first switch circuit 140 through the matching network 130.

Here, each amplifier 111 is constituted, for example, by a transistor, such as a heterojunction bipolar transistor (HBT). Incidentally, the amplifier 111 may be constituted by a field-effect transistor, such as a metal-oxide-semiconductor field-effect transistor (MOSFET), in place of an HBT.

The bias circuit 112 supplies a bias current or bias voltage to the amplifiers 111.

The control circuit 120 includes, for example, a bias adjustment circuit 121 and a decoder 122.

The decoder 122 decodes, for example, a control signal Cont10 input from another circuit (not illustrated) and generates control signals Cont11 (Cont11a and Cont11b) that control switching operations performed by the first switch circuit 140 and the second switch circuit 170. Incidentally, a control signal may be input from another circuit in place of the decoder 122.

The bias adjustment circuit 121 adjusts, in accordance with a control signal or the like from the decoder 122, a bias current or bias voltage to be supplied from the bias circuit 112 to the amplifiers 111.

The matching network (MN) 130 matches, for example, an output impedance of the amplifier 111b to, of a first switch 142, an impedance of an RF common port RFcom to which the amplified signal RFout is input. The matching network 130 is constituted, for example, by an inductor and a capacitor.

The first switch circuit 140 includes, for example, a first control unit 141 and the first switch 142.

For example, the first control unit 141 level-shifts a control signal Cont11a output from the decoder 122 by using a reference voltage generated by a power supply circuit 173 to be described to generate a control signal Cont12.

Specifically, for example, the first control unit 141 performs level conversion of the control signal cont11a and thereby generates, as the control signal Cont12, two voltages of a control signal Cont12l indicating a predetermined positive potential Vp and a control signal Cont122 indicating a predetermined negative potential Vn.

For example, the first switch 142 switches, in accordance with the control signal Cont12, between ports to be connected to the RF common port RFcom to which the amplified signal RFout is input.

Specifically, the first switch 142 is, for example, a single-pole n-throw (SPnT) switch. The first switch 142 connects, of a plurality of radio frequency signal ports RF1, RF2, . . . , and RFn (hereinafter referred to as "radio frequency signal ports RFn"), one port to the RF common port RFcom in accordance with the control signal Cont12. In FIG. 1, for convenience of explanation, only RF1, RF2, and RF3 are illustrated. The radio frequency signal ports RFn are connected to the duplexers 160 to be described through the signal paths 150.

Figure 2:
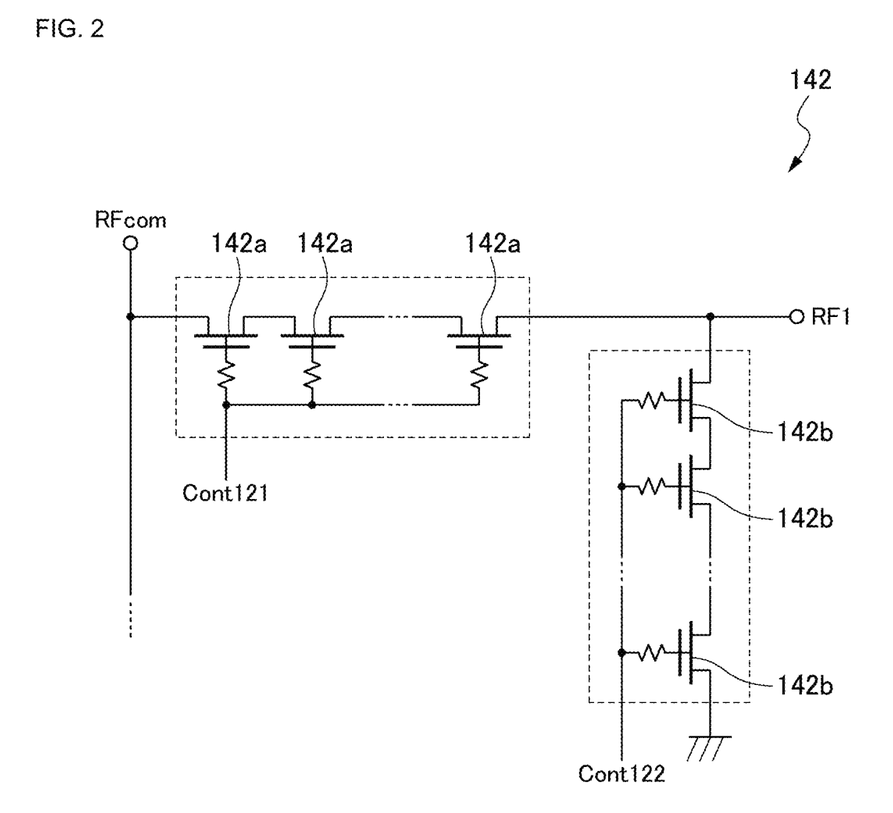
FIG. 2 illustrates an example of a circuit of a first switch.

An example of a circuit configuration of the first switch 142 will be described with reference to FIG. 2. FIG. 2 illustrates an example of a circuit of the first switch 142. As illustrated in FIG. 2, the first switch 142 includes, for example, through switches 142a and shunt switches 142b between the RF common port RFcom and each of the plurality of radio frequency signal ports RFn.

With respect to the through switches 142a, for example, one-side terminals (for example, drains) are connected to the RF common port RFcom, and other-side terminals (for example, sources) are connected to the radio frequency signal port RFn. The through switches 142a include, for example, a plurality of semiconductor element MOSFETs connected in series, and resistors connected to gates of the semiconductor element MOSFETs. In through switches 142a that pass the amplified signal RFout, the control signal Cont12l (positive potential Vp) is input to gates of the through switches 142a through the corresponding resistors.

With respect to the shunt switches 142b, for example, one-side terminals (for example, drains) are connected to the radio frequency signal port RFn, and other-side terminals (for example, sources) are connected to a ground. The shunt switches 142b include, for example, a plurality of semiconductor element MOSFETs connected in series, and resistors connected to gates of the semiconductor element MOSFETs. In shunt switches 142b corresponding to through switches 142a that pass the amplified signal RFout, the control signal Cont122 (negative potential Vn) is input to gates of the shunt switches 142b through the corresponding resistors.

The plurality of signal paths 150 are, for example, paths that electrically connect the first switch circuit 140 and the second switch circuit 170 through the duplexers 160.

Each of the duplexers (DPXs) 160 is, for example, a filter circuit. For example, when a transmission frequency and a reception frequency differ from each other, the duplexer 160 separates or combines respective signals. In FIG. 1, a transmission frequency signal passes from the first switch circuit 140 through a signal path 150 and a duplexer 160 and is transmitted to the second switch circuit 170, whereas a reception frequency signal is transmitted from the second switch circuit 170 to a receiver Rx through a duplexer 160.

The second switch circuit 170 includes a second control unit 171, a second switch 172, and the power supply circuit 173.

For example, the second control unit 171 level-shifts a control signal Cont11b output from the decoder 122 by using a reference voltage generated by the power supply circuit 173 and thereby generates a control signal Cont13 that controls the second switch 172.

Specifically, for example, the second control unit 171 performs level conversion of the control signal Cont11b and thereby generates, as the control signal Cont13, two voltages of a control signal Cont131 indicating a predetermined positive potential Vp and a control signal Cont132 indicating a predetermined negative potential Vn.

For example, the second switch 172 connects, of a plurality of radio frequency signal ports RF11, RF12, . . . and RF1n, one port to the antenna terminal Ant in accordance with the control signal Cont13.

Figure 3:
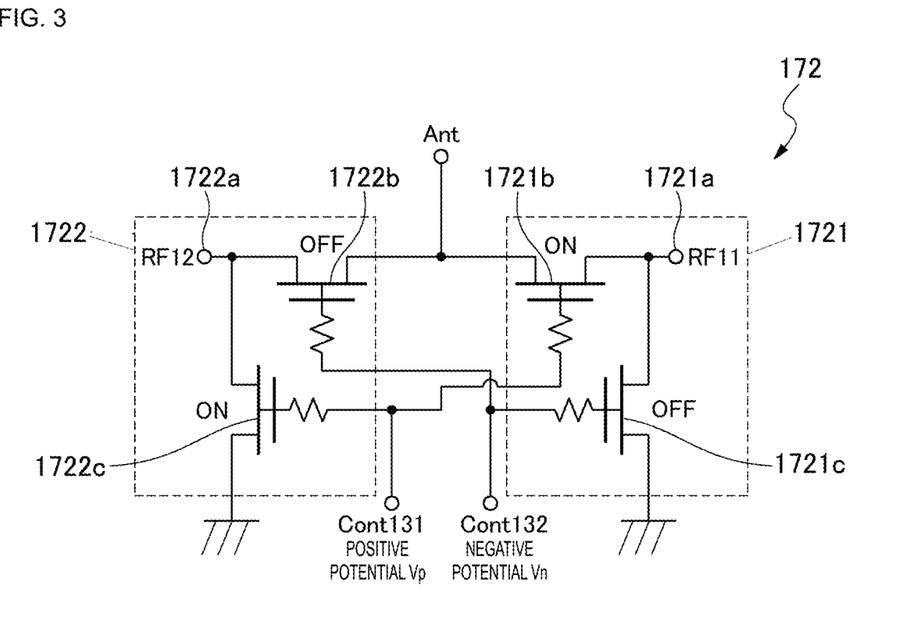
FIG. 3 illustrates an example of a circuit of a second switch.

An example of a circuit configuration of the second switch 172 will be described with reference to FIG. 3. FIG. 3 illustrates an example of a circuit of the second switch 172.

As illustrated in FIG. 3, the second switch 172 includes, for example, a first RF system 1721 and a second RF system 1722.

The first RF system 1721 includes, for example, a first RF port 1721a, a first RF through switch 1721b, and a first RF shunt switch 1721c.

The first RF port 1721a is connected to any of the plurality of signal paths 150, for example, through a switch (not illustrated) similar to the first switch 142.

With respect to the first RF through switch 1721b, for example, a one-side terminal (for example, a drain) is connected to the antenna terminal Ant, and another side terminal (for example, a source) is connected to the first RF port 1721a. The first RF through switch 1721b includes, for example, one or more semiconductor element MOSFETs connected in series, and resistors connected to gates of the one or more semiconductor element MOSFETs. For example, in the first RF through switch 1721b that passes a first RF signal, the control signal Cont131 (positive potential Vp) is input to a gate of the first RF through switch 1721b through a corresponding resistor.

With respect to the first RF shunt switch 1721c, for example, a one-side terminal (for example, a drain) is connected to the first RF port 1721a, and another side terminal (for example, a source) is connected to the ground. The first RF shunt switch 1721c includes, for example, one or more semiconductor element MOSFETs connected in series, and resistors connected to gates of the one or more semiconductor element MOSFETs. For example, in the first RF shunt switch 1721c corresponding to the first RF through switch 1721b that passes a first RF signal, the control signal Cont132 (negative potential Vn) is input to a gate of the first RF shunt switch 1721c through a corresponding resistor.

The second RF system 1722 includes, for example, a second RF port 1722a, a second RF through switch 1722b, and a second RF shunt switch 1722c. As in the first RF port 1721a, the second RF port 1722a is connected to any of the plurality of signal paths 150. The second RF through switch 1722b and the second RF shunt switch 1722c are similar to the first RF through switch 1721b and the first RF shunt switch 1721c, and a description thereof is therefore omitted.

Here, the operation of the second switch 172 will be described with reference to FIG. 3. FIG. 3 illustrates a state of the second switch in a first RF mode. As illustrated in FIG. 3, in the first RF mode, the control signal Cont132 (negative potential Vn) is applied to the gate of the first RF shunt switch 1721c. Here, parasitic capacitance is formed between the gate and drain of the first RF shunt switch 1721c and between the gate and source. At this time, when an RF signal of, for example, 36 dBm is applied to the first RF port 1721a, a radio frequency voltage of about 14 V is applied between the drain and source of the first RF shunt switch 1721c in an OFF state. The radio frequency voltage is developed at the gate as well through the parasitic capacitance. In the second switch 172, when the radio frequency voltage developed at the gate exceeds a threshold used to keep the first RF shunt switch 1721c in the OFF state, the first RF shunt switch 1721c is falsely turned ON. To keep the first RF shunt switch 1721c from being falsely turned ON, in the second switch 172, an absolute value of the negative potential Vn of the control signal Cont132 to be applied to the gate of the first RF shunt switch 1721c has to be made sufficiently large. Alternatively, in the second switch 172, when the first RF shunt switch 1721c having multiple stages is provided, a drain-source voltage may be divided.

Incidentally, although FIGS. 2 and 3 illustrate various switches constituted by MOSFETs, the present disclosure is not limited to this. Each switch may be constituted by another semiconductor element, such as a diode.

The power supply circuit 173 is, for example, a charge-pump circuit. The power supply circuit 173 generates the positive potential Vp and the negative potential Vn that have been described above and supplies the positive potential Vp and the negative potential Vn to the first control unit 141 and the second control unit 171 that are incorporated in the power amplifier module 100.

The power supply circuit 173 is incorporated, for example, of a plurality of switch circuits in the power amplifier module 100, on the same IC chip as a switch circuit different from a switch circuit closest to the power amplifier circuit 110. In this embodiment, the first switch circuit 140 is closer to the power amplifier circuit 110 than the second switch circuit 170 is, and thus the power supply circuit 173 is incorporated in the second switch circuit 170.

Figure 11:
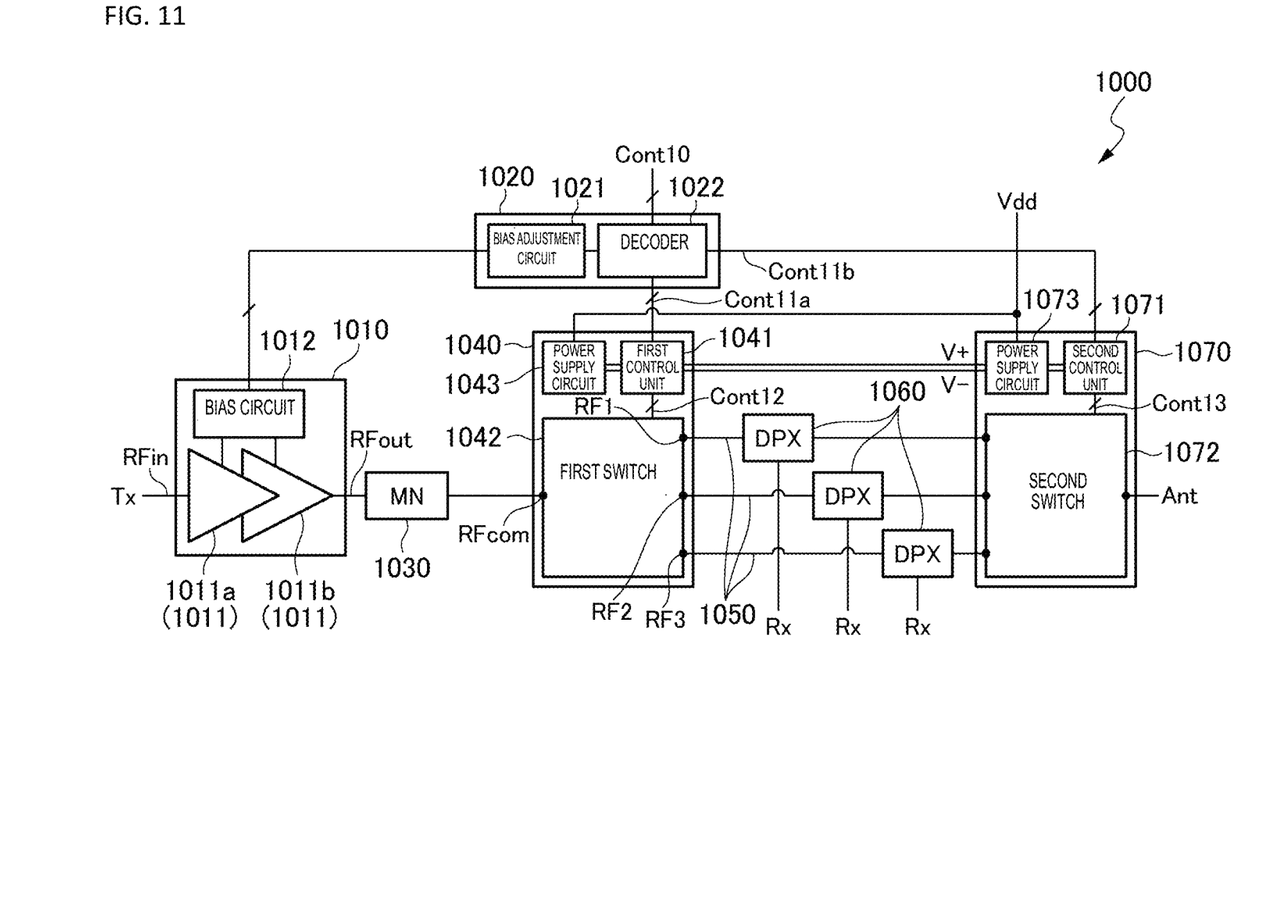
FIG. 11 illustrates an example of a configuration of a typical power amplifier module.

FIG. 11 illustrates an example of a configuration of a typical power amplifier module. As illustrated in FIG. 11, in a typical power amplifier module 1000, switch circuits 1040 and 1070 include respective power supply circuits 1043 and 1073. Here, noise caused by the switching on and off of the power supply circuit 1043 of the switch circuit 1040 close to the power amplifier circuit 1010 may be input to the power amplifier circuit 1010 due to electromagnetic induction, electrostatic induction, or the like and may be amplified.

In the power amplifier module 100 according to this embodiment, the power supply circuit 173 is provided in the second switch circuit 170 disposed further away from the power amplifier circuit 110, and thus such noise can be kept from being input to the power amplifier circuit 110.

Furthermore, the power amplifier module 100 includes no filter circuit between the second switch circuit 170 and the antenna terminal Ant. Hence, in the second switch circuit 170, lower distortion than that in the first switch circuit 140 is demanded. Furthermore, the second switch circuit 170 is connected to a reception system, and thus low loss is demanded. The second switch circuit 170 is lower than the first switch circuit 140 in input power, whereas the second switch circuit 170 has to have higher resistance to power than the first switch circuit 140 because the second switch circuit 170 is subjected to load variations of the antenna terminal Ant.

For this reason, the second switch circuit 170 has to include shunt switches 1721c and 1722c in which the number of FETs connected in series is larger than that in the first switch circuit 140. Alternatively, if an increase in size involved in FETs connected to form multiple stages is desired to be avoided, in the power amplifier module 100, a voltage supplied from the power supply circuit 173 to the second switch circuit 170 has to be made higher than a voltage supplied to the first switch circuit 140.

In the power amplifier module 100 according to this embodiment, the power supply circuit 173 is provided so as to be integrated into the second switch circuit 170 to which a reference voltage equal to or higher than a reference voltage supplied to the first switch circuit 140 has to be supplied and can thus supply voltages necessary and sufficient for the respective switch circuits 140 and 170. Furthermore, in the power amplifier module 100, the power supply circuit 173 is not provided in the first switch circuit 140, and thus the first switch circuit 140 can be reduced in size.

Incidentally, a bypass capacitor may be provided at a power supply terminal (not illustrated) of the second switch circuit 170. The bypass capacitor may be provided on an IC chip where the second switch circuit 170 is formed or may be provided on a module substrate where the IC chip is mounted.

An example of positional relationships between a module substrate and components will be described with reference to FIGS. 4A, 4B, 5A, and 5B. FIGS. 4A, 4B, 5A, and 5B illustrate an example of positional relationships between a module substrate and components. In FIGS. 4A, 4B, 5A, and 5B, a direction along one edge side of a rectangular module substrate is an X direction, a direction orthogonal to the X direction is a Y direction, and a direction orthogonal to the X direction and the Y direction is a Z direction.

Figure 4A:
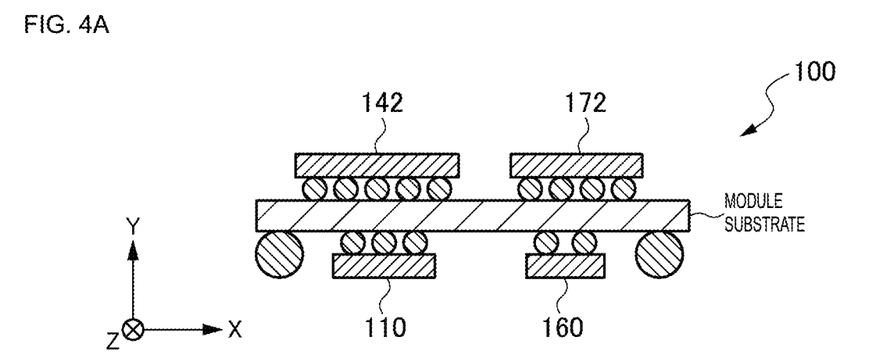
FIG. 4A illustrates an example of positional relationships between a module substrate and components.
Figure 4B:
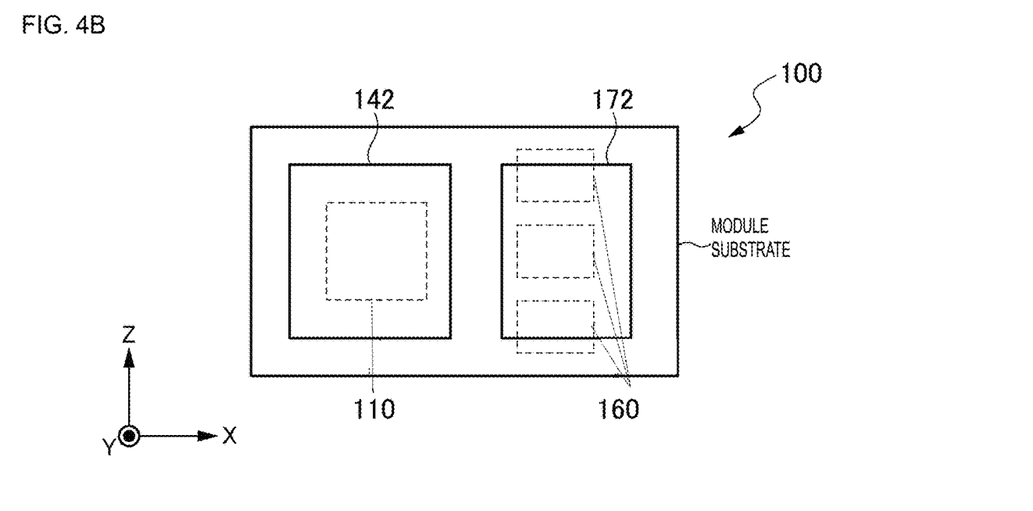
FIG. 4B illustrates an example of positional relationships between the module substrate and the components.

As illustrated in FIG. 4B, the first switch circuit 140 may be disposed, for example, on a largest side of the module substrate so as to overlay the power amplifier circuit 110 in a perpendicular direction (Y direction). As illustrated in FIG. 4A, in order that the distance between the power amplifier circuit 110 and the second switch circuit 170 is longer than the distance between the power amplifier circuit 110 and the first switch circuit 140, the second switch circuit 170 may be disposed, for example, on a surface of the same side of the module substrate as the first switch circuit 140. This enables three-dimensional mounting of IC chips that reduces noise to the power amplifier circuit 110, and also enables a reduction in the size of the power amplifier module 100.

Figure 5A:
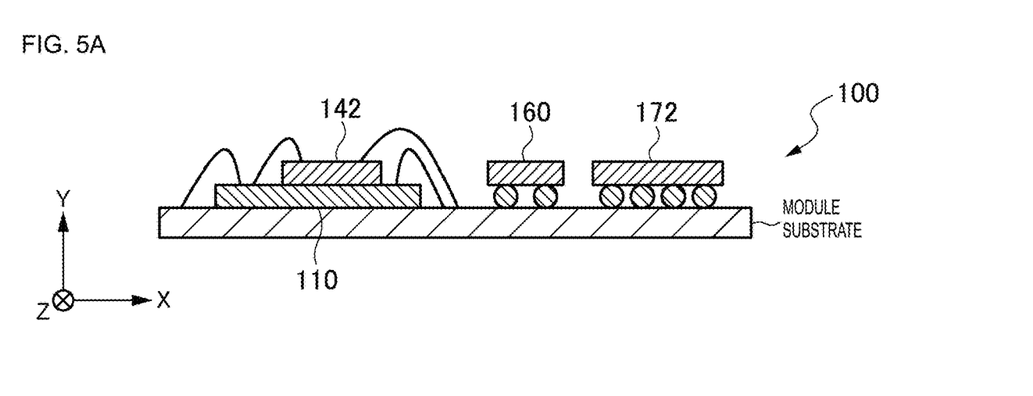
FIG. 5A illustrates an example of positional relationships between the module substrate and the components.
Figure 5B:
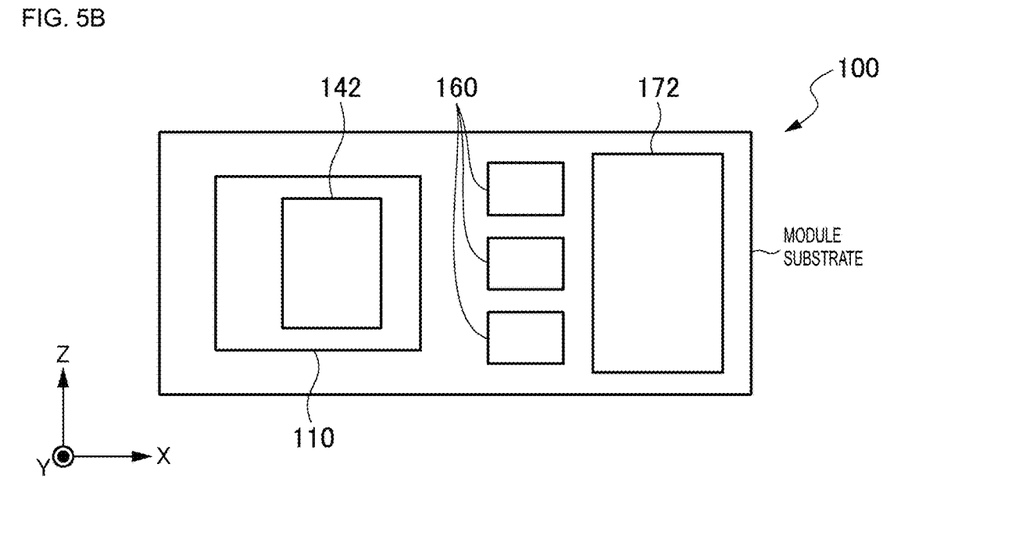
FIG. 5B illustrates an example of positional relationships between the module substrate and the components.

As illustrated in FIG. 5B, the first switch circuit 140 may be disposed to lie, for example, on the power amplifier circuit 110 disposed on a largest side of the module substrate. As illustrated in FIG. 5A, in order that the distance between the power amplifier circuit 110 and the second switch circuit 170 is longer than the distance between the power amplifier circuit 110 and the first switch circuit 140, the second switch circuit 170 may be disposed, for example, on a surface of the same side of the module substrate as the first switch circuit 140 with duplexers 160 interposed between the first switch circuit 140 and the second switch circuit 170. This enables three-dimensional mounting of IC chips that reduces noise to the power amplifier circuit 110, and also enables a reduction in the size of the power amplifier module 100.

Power Amplifier Module 200 According to Second Embodiment

Figure 6:
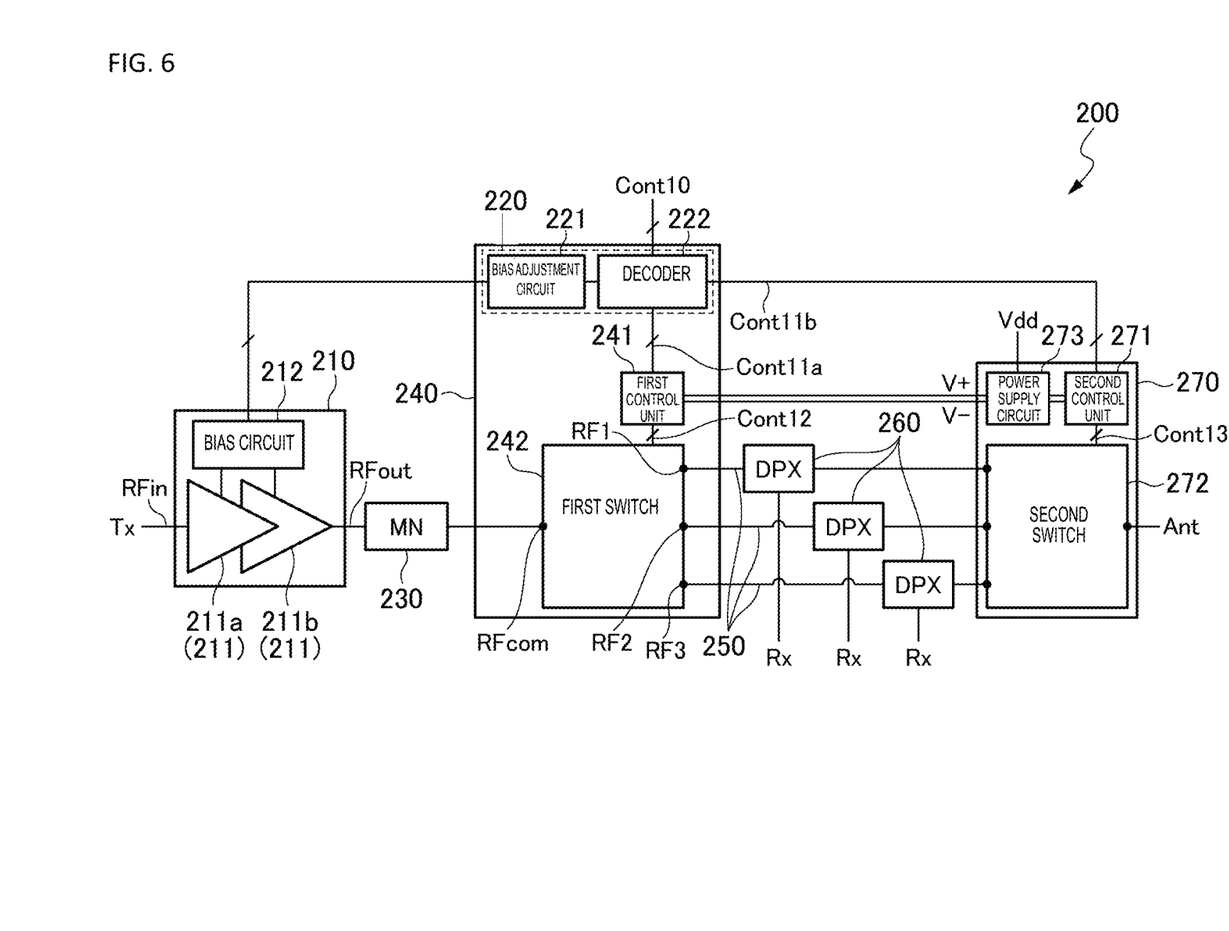
FIG. 6 illustrates an example of a configuration of a power amplifier module according to a second embodiment.

A power amplifier module 200 according to a second embodiment will be described with reference to FIG. 6. FIG. 6 illustrates an example of a configuration of the power amplifier module 200 according to the second embodiment.

As illustrated in FIG. 6, in comparison with the power amplifier module 100 according to the first embodiment, in the power amplifier module 200 according to the second embodiment, a control circuit 220 is integrated into an IC chip of a first switch circuit 240.

When a plurality of components are integrated into one IC chip, the power amplifier module 200 can be reduced in size. Furthermore, when a power supply circuit 273 is integrated into another IC chip (second switch circuit 270) different from an IC chip of a power amplifier circuit 210, the influence of noise on the power amplifier circuit 210 can be reduced.

Power Amplifier Module 300 According to Third Embodiment

Figure 7:
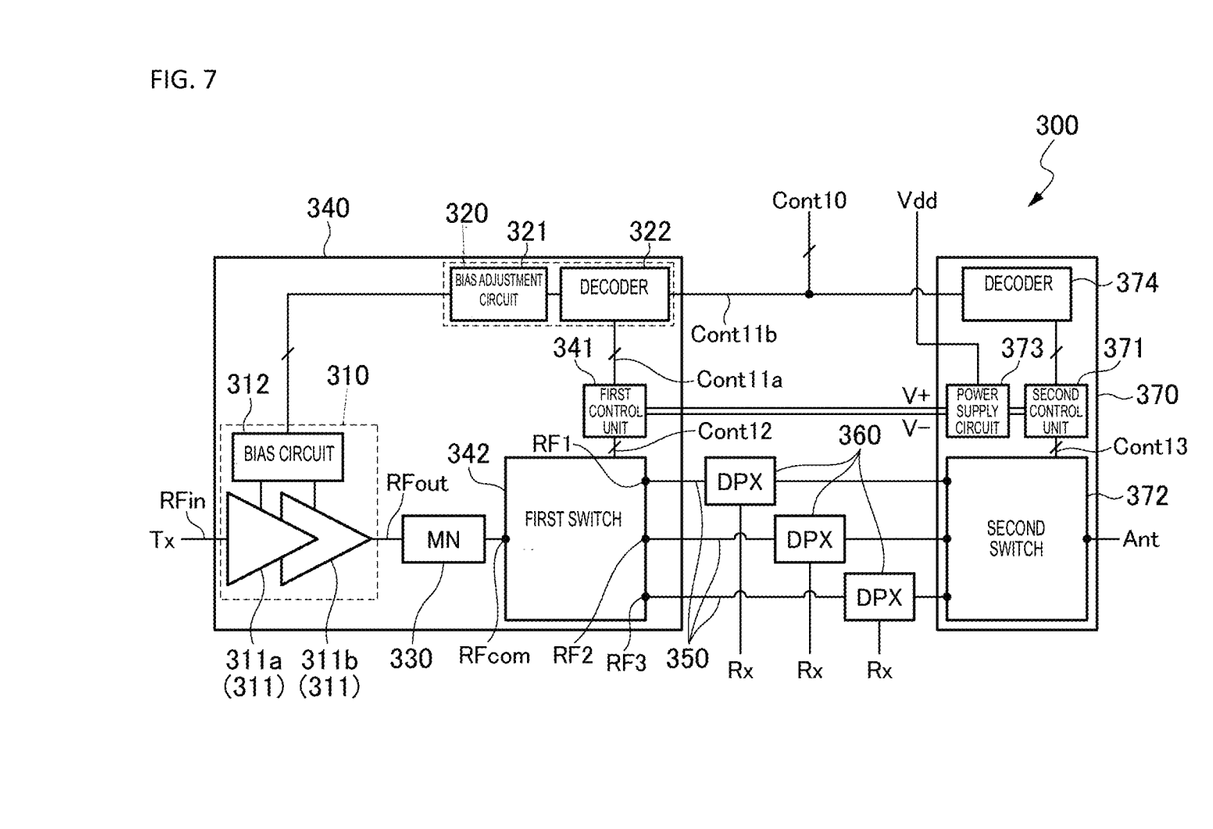
FIG. 7 illustrates an example of a configuration of a power amplifier module according to a third embodiment.

A power amplifier module 300 according to a third embodiment will be described with reference to FIG. 7. FIG. 7 illustrates an example of a configuration of the power amplifier module 300 according to the third embodiment.

As illustrated in FIG. 7, in comparison with the power amplifier module 100 according to the first embodiment, in the power amplifier module 300 according to the third embodiment, a power amplifier circuit 310, a control circuit 320, and a matching network 330 are integrated into an IC chip of a first switch circuit 340.

In the power amplifier module 300, when components not including a power supply circuit 373 are integrated into one IC chip, the influence of noise on the power amplifier circuit 310 is reduced, and the power amplifier module 300 is also reduced further in size.

Incidentally, the matching network 330 may be disposed, for example, solely outside the IC chip. Furthermore, in the case where the number of control lines for a second switch circuit 370 including the power supply circuit 373 is large, a decoder 322 may be provided for each IC chip. In other words, the decoder 322 may be integrated into one IC chip, or the decoder 322 may be provided for each IC chip.

Power Amplifier Module 400 According to Fourth Embodiment

Figure 8:
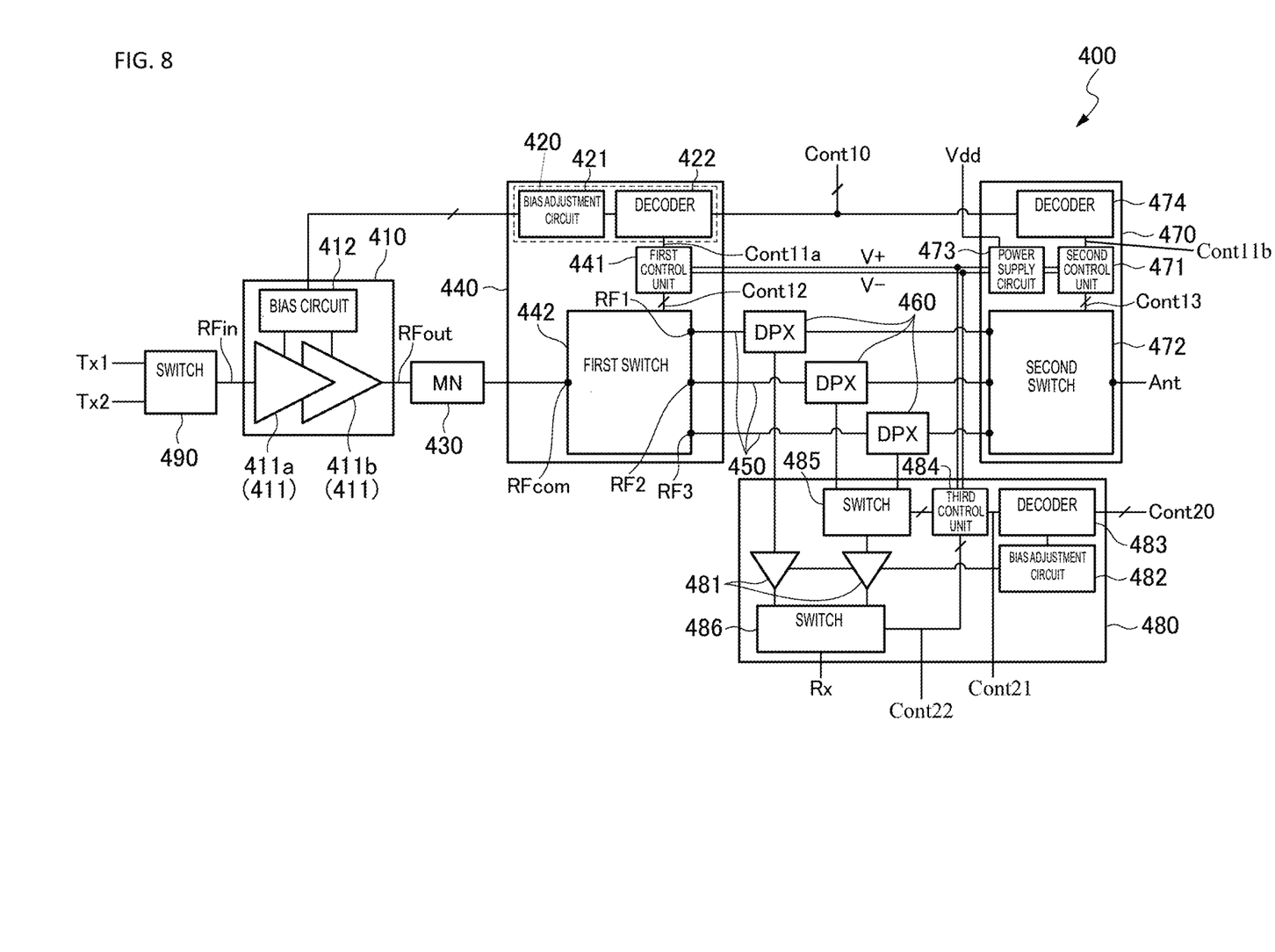
FIG. 8 illustrates an example of a configuration of a power amplifier module according to a fourth embodiment.

A power amplifier module 400 according to a fourth embodiment will be described with reference to FIG. 8. FIG. 8 illustrates an example of a configuration of the power amplifier module 400 according to the fourth embodiment.

As illustrated in FIG. 8, in comparison with the power amplifier module 100 according to the first embodiment, the power amplifier module 400 according to the fourth embodiment includes a low noise amplifier circuit 480 that amplifies a reception signal received at the antenna terminal Ant.

The low noise amplifier circuit 480 includes, for example, amplifiers 481, a bias circuit (not illustrated), a bias adjustment circuit 482, a decoder 483, a third control unit 484, a switch 485, and a switch 486. The amplifiers 481, the bias circuit (not illustrated), the bias adjustment circuit 482, the decoder 483, the third control unit 484, the switch 485, and the switch 486 are similar to, in the power amplifier module 100 according to the first embodiment, the amplifiers 111, the bias circuit 112, the bias adjustment circuit 121, the decoder 122, the first and second control units 141 and 171, and the first switch 142, and a description thereof is therefore omitted. Here, the switch 485 and the switch 486 are band-changing switches.

A power supply circuit 473 incorporated in a second switch circuit 470 supplies a reference voltage to the third control unit 484. The third control unit 484 level-shifts a control signal Cont21 output from the decoder 483 by using a reference voltage generated by the power supply circuit 473 and thereby generates control signals Cont22 that control the switch 485 and the switch 486.

In the power amplifier module 400, when the power supply circuit 473 is integrated into one IC chip, even in a more complicated module configuration, noise to a power amplifier circuit 410 is reduced. Furthermore, the power amplifier module 400 is reduced in size while also achieving a reduction in noise to the low noise amplifier circuit 480.

Furthermore, as illustrated in FIG. 8, the power amplifier module 400 may include a switch 490 that can connect RF signals from a plurality of transmitters to the power amplifier circuit 410. The switch 490 may be controlled by a control unit (not illustrated) to which a reference voltage is supplied from the power supply circuit 473.

Furthermore, it is even better that duplexers 460 are configured to be capable of reducing noise in a frequency band caused by the power supply circuit 473 for reception frequency band signals. This is because, even if the second switch circuit 470 picks up noise caused by the power supply circuit 473, the noise can be removed from reception frequency band signals to be transmitted to the low noise amplifier circuit 480.

Power Amplifier Module 500 According to Fifth Embodiment

Figure 9:
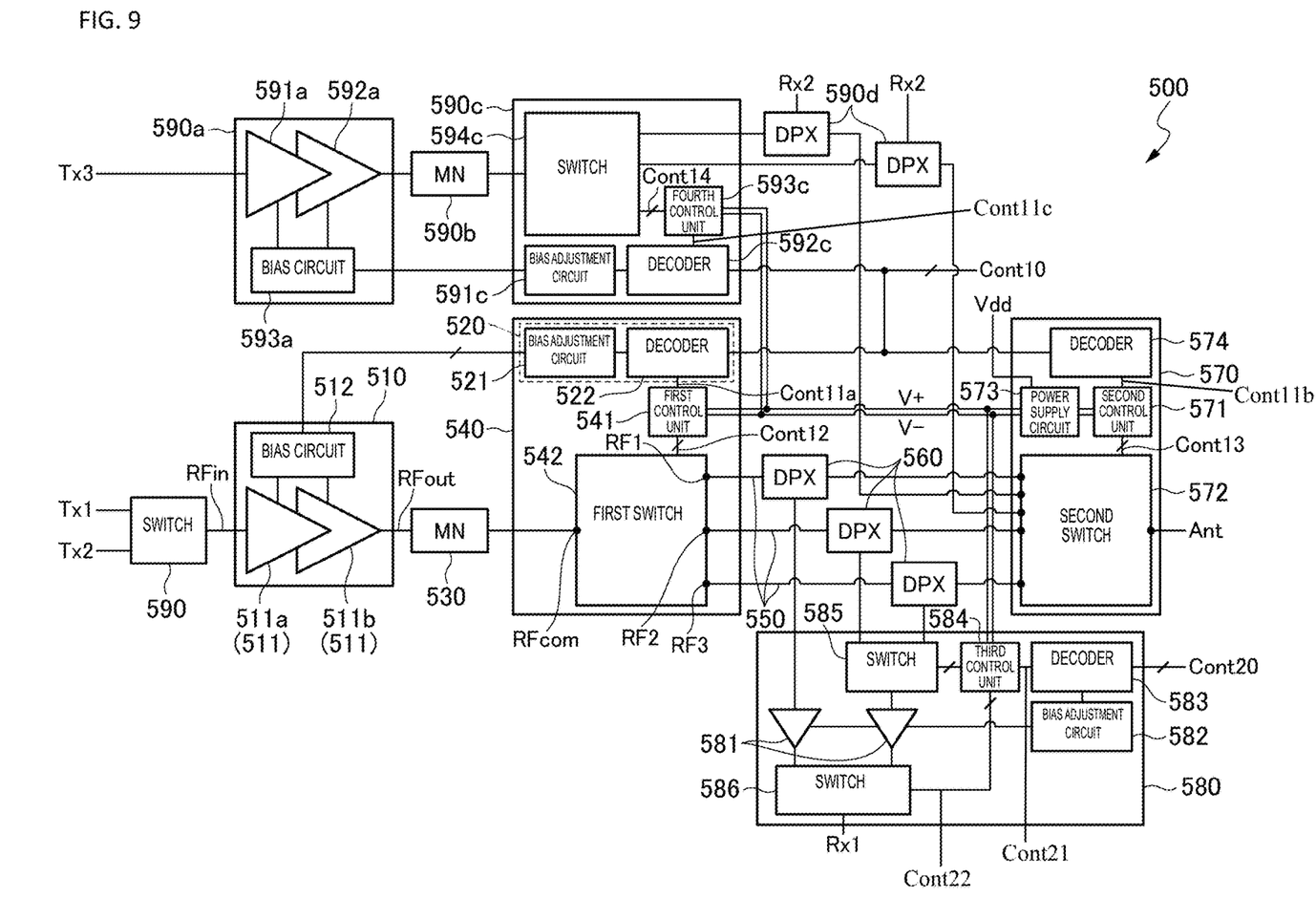
FIG. 9 illustrates an example of a configuration of a power amplifier module according to a fifth embodiment.

A power amplifier module 500 according to a fifth embodiment will be described with reference to FIG. 9. FIG. 9 illustrates a configuration of the power amplifier module 500 according to the fifth embodiment.

As illustrated in FIG. 9, in comparison with the power amplifier module 400 according to the fourth embodiment, the power amplifier module 500 according to the fifth embodiment includes a power amplifier circuit 590a, a matching network 590b, a switch circuit 590c, and duplexers 590d. The power amplifier module 500 according to the fifth embodiment may be a power amplifier module including two transmission systems in comparison with the power amplifier module 100 according to the first embodiment.

The power amplifier circuit 590a, the matching network 590b, the switch circuit 590c, and the duplexers 590d are similar to the power amplifier circuit 410, a matching network 430, a first switch circuit 440, and the duplexers 460 in the power amplifier module 400 according to the fourth embodiment, and a description thereof is therefore omitted.

A power supply circuit 573 incorporated in a second switch circuit 570 supplies a reference voltage to a fourth control unit 593c. The fourth control unit 593c level-shifts a control signal Cont11c output from a decoder 592c by using a reference voltage generated by the power supply circuit 573 and thereby generates a control signal Cont14 that controls a switch 594c.

Thus, in the power amplifier module 500, since the power supply circuit 573 is integrated into one IC chip, even in a more complicated module configuration, the power amplifier module 500 can be reduced in size while achieving reductions in noise to the power amplifier circuits 510 and 590a.

Incidentally, the power supply circuit 573 of the power amplifier module 500 may be configured to supply no reference voltage to a third control unit 584.

Power Amplifier Module 600 According to Sixth Embodiment

Figure 10:
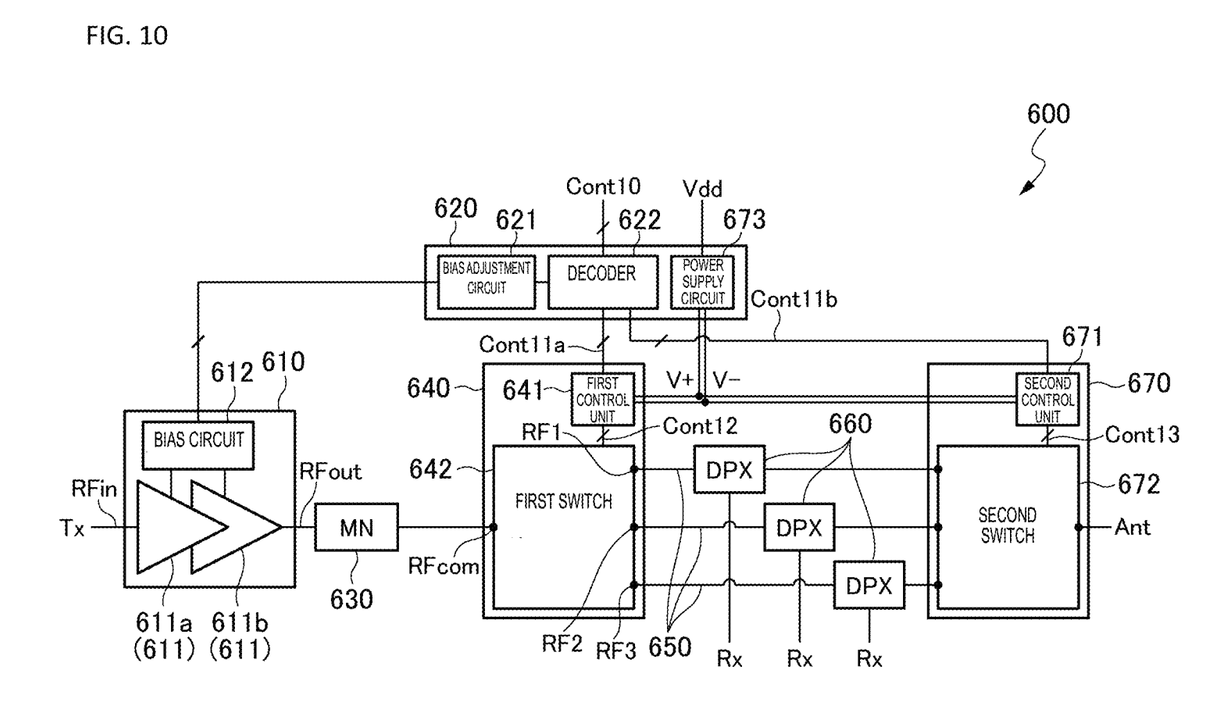
FIG. 10 illustrates an example of a configuration of a power amplifier module according to a sixth embodiment.

A power amplifier module 600 according to a sixth embodiment will be described with reference to FIG. 10. FIG. 10 illustrates a configuration of the power amplifier module 600 according to the sixth embodiment.

As illustrated in FIG. 10, in comparison with the power amplifier module 100 according to the first embodiment, in the power amplifier module 600 according to the sixth embodiment, a power supply circuit 673 is integrated into an IC chip of a control circuit 620.

Thus, since the power supply circuit 673 is provided on the IC chip different from an IC chip of a first switch circuit 640 closest to a power amplifier circuit 610, the influence of noise on the power amplifier circuit 610 can be reduced while achieving a reduction in the size of the power amplifier module 600.

SUMMARY

The power amplifier modules 100 to 500 according to exemplary embodiments of the present disclosure respectively include the power amplifier circuits 110 to 510 (first power amplifiers) that amplify an input signal and output a transmission signal (first transmission signal); the first switch circuits 140 to 540 that receive input of the transmission signal (first transmission signal) and perform switching to, of the plurality of signal paths 150, a signal path 150 through which the transmission signal (first transmission signal) passes; and the second switch circuits 170 to 570 that receive input of the transmission signal (first transmission signal) output from the first switch circuits 140 to 540 through the signal path 150 to which the first switch circuits 140 to 540 have performed switching and switch between signal paths to the antenna terminal Ant. The second switch circuits 170 to 570 respectively include the power supply circuits 173 to 573 that supply a reference voltage to the first switch circuits 140 to 540 and the second switch circuits 170 to 570. Thus, in the power amplifier module 100, since the power supply circuit 173 is provided further away from the power amplifier circuit 110, noise from the power supply circuit 173 can be kept from being input to the power amplifier circuit 110. Furthermore, in the power amplifier module 100, the first switch circuit 140 can be reduced in size.

Furthermore, the first switch circuit 240 of the power amplifier module 200 includes the control circuit 220 that generates a first control signal for controlling the first switch circuit 240 and a second control signal for controlling the second switch circuit 270. This can reduce the influence of noise on the power amplifier circuit 210 while achieving a reduction in the size of the power amplifier module 200.

Furthermore, the first switch circuit 340 of the power amplifier module 300 includes the power amplifier circuit 310 (first power amplifier). This can reduce the influence of noise on the power amplifier circuit 310 while achieving a reduction in the size of the power amplifier module 300.

Furthermore, the power amplifier modules 100 to 500 further respectively include the duplexers 160 to 560 provided in the respective plurality of signal paths 150 to 550. The transmission signal (first transmission signal) output from the first switch circuits 140 to 540 is input to the second switch circuits 170 to 570 through duplexers 160 to 560. This increases the respective distances between the first switch circuits 140 to 540 and the second switch circuits 170 to 570, thus enabling increases in the respective distances between the power amplifier circuits 110 to 510 and the second switch circuits 170 to 570 and enabling reductions in noise to the power amplifier circuits 110 to 510.

Furthermore, the power amplifier module 400 further includes the low noise amplifier circuit 480 that amplifies a reception signal received by the antenna terminal Ant and input through a filter circuit. The low noise amplifier circuit 480 includes the switches 485 and 486 (third switch circuit) that switch between paths of the reception signal. The power supply circuit 473 supplies a reference voltage to the switches 485 and 486 (third switch circuit). Thus, even in a more complicated module configuration, the power amplifier module 400 can be reduced in size while achieving reductions in noise to the power amplifier circuit 410 and the low noise amplifier circuit 480.

Furthermore, the power amplifier module 500 further includes a transmission system (transmission circuit) including the power amplifier circuit 590a (second power amplifier) that outputs a transmission signal (second transmission signal) and the switch circuit 590c (fourth switch circuit) that switches between signal paths of the output transmission signal (second transmission signal). The power supply circuit 573 supplies a reference voltage to the switch circuit 590c (fourth switch circuit). Thus, even in a more complicated module configuration, the power amplifier module 500 can be reduced in size while achieving a reduction in noise.

Furthermore, the second switch circuits 170 to 570 of the power amplifier modules 100 to 500 may have a function of switching between a transmission mode in which a transmission signal is transmitted from the antenna terminal Ant and a reception mode in which a reception signal is received from the antenna terminal Ant. This enables single power amplifier modules 100 to 500 to support both frequency division duplex and time division duplex.

Furthermore, the power supply circuits 173 to 573 of the power amplifier modules 100 to 500 are charge-pump circuits that supply a reference voltage. Thus, a positive voltage and a negative voltage can be appropriately supplied, therefore enabling the first switch circuits 140 to 540 and the second switch circuits 170 to 570 to operate appropriately.

The above-described embodiments are intended to facilitate understanding of the present disclosure but are not intended for a limited interpretation of the present disclosure. The present disclosure can be changed or improved without necessarily departing from the gist thereof and also encompasses equivalents thereof. In other words, appropriate design changes made to the embodiments by those skilled in the art are also encompassed in the scope of the present disclosure as long as the changes have features of the present disclosure. The elements included in the embodiments, and the arrangement and so forth of the elements are not limited to those exemplified herein and can be appropriately changed.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier module comprising:
   a first power amplifier configured to amplify an input signal and to output a first transmission signal;
   a first switch circuit configured to receive the first transmission signal and to selectively pass the first transmission signal through one of a plurality of signal paths; and
   a second switch circuit configured to receive the first transmission signal from the first switch circuit through the selected signal path, and to selectively connect the selected signal path to an antenna terminal,
   wherein the second switch circuit comprises a power supply circuit configured to supply a reference voltage to the first switch circuit and to the second switch circuit.

2. The power amplifier module according to claim 1, wherein the first switch circuit comprises a control circuit configured to generate a first control signal that controls the first switch circuit, and a second control signal that controls the second switch circuit.

3. The power amplifier module according to claim 1, wherein the first switch circuit comprises the first power amplifier.

4. The power amplifier module according to claim 1, further comprising:
   a plurality of duplexers, each duplexer being in a respective one of the plurality of signal paths,
   wherein the first transmission signal passes through one of the plurality of duplexers between the first switch circuit and the second switch circuit.

5. The power amplifier module according to claim 4, further comprising:
   a low noise amplifier circuit configured to amplify a reception signal received by the antenna terminal and that passes through one of the plurality of duplexers,
   wherein the low noise amplifier circuit comprises a third switch circuit configured to selectively receive the reception signal through one of a plurality of reception signal paths, and
   wherein the power supply circuit is configured to supply a third reference voltage to the third switch circuit.

6. The power amplifier module according to claim 1, further comprising:
   a transmission circuit comprising a second power amplifier configured to output a second transmission signal, and a fourth switch circuit configured to selectively pass the second transmission signal through one of a second plurality of signal paths,
   wherein the power supply circuit is configured to supply a fourth reference voltage to the fourth switch circuit.

7. The power amplifier module according to claim 1, wherein the second switch circuit is further configured to selectively switch between a transmission mode in which a transmission signal is transmitted to the antenna terminal, and a reception mode in which a reception signal is received from the antenna terminal.

8. The power amplifier module according to claim 1, wherein the power supply circuit is a charge-pump circuit configured to supply the reference voltage.

* * * * *